(12) United States Patent
Kanbe

(10) Patent No.: US 8,198,121 B2
(45) Date of Patent: Jun. 12, 2012

(54) METHOD OF MANUFACTURING SOLID-STATE IMAGING DEVICE

(75) Inventor: Hideo Kanbe, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/724,259

(22) Filed: Mar. 15, 2010

(65) Prior Publication Data

US 2010/0171857 A1 Jul. 8, 2010

Related U.S. Application Data

(63) Continuation of application No. 11/119,138, filed on Apr. 30, 2005.

(30) Foreign Application Priority Data

May 7, 2004 (JP) ................................ 2004-138897

(51) Int. Cl.
*H01L 27/148* (2006.01)
(52) U.S. Cl. ... 438/75; 257/245; 257/249; 257/E27.151; 348/304; 348/308
(58) Field of Classification Search .................. 257/214, 257/215, 249
See application file for complete search history.

(56) References Cited

U.S. PATENT DOCUMENTS

| | | | | |
|---|---|---|---|---|
| 5,256,890 | A * | 10/1993 | Furukawa et al. | 257/233 |
| 5,917,208 | A * | 6/1999 | Hatano | 257/249 |
| 6,187,608 | B1 * | 2/2001 | Jeong | 438/57 |
| 7,446,358 | B2 * | 11/2008 | Kanbe | 257/292 |
| 7,738,021 | B2 * | 6/2010 | Iwamoto | 348/311 |
| 2002/0024066 | A1 * | 2/2002 | Ide | 257/214 |
| 2003/0214598 | A1 * | 11/2003 | Shizukuishi | 348/308 |

FOREIGN PATENT DOCUMENTS

| | | |
|---|---|---|
| JP | 05-48069 | 2/1993 |
| JP | 05-315588 | 11/1993 |
| JP | 06-097410 | 4/1994 |
| JP | 08-274307 | 10/1996 |
| JP | 2000-232217 | 8/2000 |
| JP | 2001-053258 | 2/2001 |
| JP | 10-223881 | 11/2008 |

OTHER PUBLICATIONS

Japanese Office Action issued on Jan. 15, 2008, for counterpart Japanese Application No. 2004-138897, filed on May 7, 2004.
Japanese Office Action issued on Jul. 1, 2008, for counterpart Japanese Application No. 2004-138897, filed on May 7, 2004.

* cited by examiner

*Primary Examiner* — Nathan W. Ha
*Assistant Examiner* — Abul Kalam
(74) *Attorney, Agent, or Firm* — SNR Denton US LLP

(57) ABSTRACT

A method of manufacturing a solid-state imaging device. Light-receiving sensor portions each constituting a pixel in the form of a matrix is arranged. The matrix has columns aligned in a vertical direction and rows aligned in a horizontal direction. Charge-transfer portions are formed on either side of the columns of said pixels. Transfer electrodes in said charge-transfer portions are formed to include a first transfer electrode formed of a first electrode layer and a second transfer electrode formed by electrically connecting the first electrode layer and a second electrode layer through a contact. The second transfer electrode being disposed in the vertical direction above the charge-transfer portion in a vicinity of the contact to decrease the width of the charge-transfer portions in the horizontal direction and increase the light receiving sensor portions in the vertical direction.

9 Claims, 3 Drawing Sheets

METHOD OF MANUFACTURING SOLID-STATE IMAGING DEVICE

CROSS REFERENCES TO RELATED APPLICATIONS

This application is a continuation of U.S. patent application Ser. No. 11/119,138, filed Apr. 30, 2005, the entirety of which is incorporated herein by reference to the extent permitted by law. The present invention contains subject matter related to and claims the benefit of priority from the prior Japanese Patent Application JP 2004-138897, filed in the Japanese Patent Office on May 7, 2004, the disclosure of which is hereby incorporated herein by reference in its entirety.

BACKGROUND OF THE INVENTION

1. Field of the Invention

The present invention relates to a solid-state imaging device including a charge-transfer portion, such as a CCD solid-state imaging device, a method of manufacturing a solid-state imaging device, and a method of driving a solid-state imaging device.

2. Description of the Related Art

In a CCD solid-state imaging device, a transfer resistor having a CCD structure is provided as a charge-transfer portion, and a signal charge obtained through photoelectric conversion and stored in a light-receiving sensor portion formed of a photodiode is read out to the transfer resistor so that the signal charge is transferred in the transfer resistor.

The transfer resistor includes through an insulation film a transfer electrode formed on a transfer channel in which a signal charge is transferred. In order to transfer a signal charge, it is necessary to apply voltage pulses having different phases from each other to the transfer electrodes adjacent to each other, and also it is necessary to prevent a gap from occurring in the channel. Accordingly, the transfer electrode is made to include two electrode layers of a first and second layers, and the edge of the second-layer transfer electrode is made to somewhat overlap the first-layer transfer electrode (refer to Patent Literature 1, for example).

A schematic constitutional view (plan view) of a CCD solid-state imaging device including a transfer electrode formed of two electrode layers in this manner is shown in FIG. 1.

As shown in FIG. 1, with respect to this CCD solid-state imaging device, light-receiving sensor portions 51 are arranged in the form of a matrix, and a vertical transfer resistor 52 which extends vertically (in the upward and downward directions in the figure) is provided on one side of each column of the light-receiving sensor portions 51 as a charge-transfer portion. Although not shown in the figure, a horizontal transfer resistor is connected to one end of the vertical transfer resistor 52.

Further, with respect to the CCD solid-state imaging device shown in FIG. 1, a sectional view of the vertical transfer resistor 52 is shown in FIG. 2A, and a sectional view of a portion between light-receiving sensor portions 51 adjacent to each other in the vertical direction, namely a portion between pixels, is shown in FIG. 2B. Note that in FIGS. 2A and 2B, description of semiconductor regions (each region in a light-receiving sensor portion, a transfer channel region and the like) in a semiconductor substrate is omitted.

The vertical transfer resistor 52 includes a transfer electrode 53 and a transfer channel region (not shown in the figures) formed in a semiconductor substrate 54, constituting a charge-transfer portion of a CCD structure.

Further, as the transfer electrode 53, transfer electrodes 53B and 53D formed of a first electrode layer and transfer electrodes 53A and 53C formed of a second electrode layer are alternately disposed in the vertical direction.

In addition, the edges of the transfer electrodes 53A and 53C of the second layer somewhat overlap the transfer electrodes 53B and 53D of the first layer in the vertical transfer resistor 52.

Recently, to cope with the increase in pixel numbers and miniaturization of a digital camera, a pixel cell of a solid-state imaging device has been improved to be minute.

Hence, in order to obtain high sensitivity as well as miniaturization of a pixel cell of a solid-state imaging device, higher light-receiving efficiency is desired.

However, in the CCD solid-state imaging device including the transfer electrode 53 in which two electrode layers overlap, as shown in FIG. 1 and FIGS. 2A and 2B, projections and cavities around the light-receiving sensor portion 51 become large at the overlapped portions of the transfer electrode 53, so that incident light is partially blocked by the portion.

Hence, it is difficult to improve the efficiency in receiving light.

The overlapped portion of the transfer electrode 53 has normally the thickness of 1 µm or more, so that particularly when the size of a pixel cell is 3 µm or less and the width of an opening on the light-receiving sensor portions 51 is reduced to 1 µm or so, incident light may be partially blocked by the overlapped portions.

[Patent Literature 1] Published Japanese Patent Application No. H9-312390

SUMMARY OF THE INVENTION

On the other hand, a CCD solid-state imaging device in which no overlap occurs in a transfer electrode and the transfer electrode is formed of a single electrode layer has also been proposed.

A schematic constitutional view (plan view) of a CCD solid-state imaging device in which a transfer electrode is formed of a single electrode layer as described above is shown in FIG. 3.

As shown in FIG. 3, with respect to this CCD solid-state imaging device, light-receiving sensor portions 61 are arranged in the form of a matrix, and a vertical transfer resistor 62 which extends vertically (in the upward and downward directions in the figure) is provided on one side of each column of the light-receiving sensor portions 61 as a charge-transfer portion. Although not shown in the figure, a horizontal transfer resistor is connected to one end of the vertical transfer resistor 62.

Further, with respect to the CCD solid-state imaging device of FIG. 3, a sectional view of the vertical transfer resistor 62 is shown in FIG. 4A, and a sectional view of a portion between pixels adjacent to each other in the vertical direction is shown in FIG. 4B. Note that in FIGS. 4A and 4B, description of semiconductor regions (each region in a light-receiving sensor portion, a transfer channel region, and the like) in a semiconductor substrate is omitted.

The vertical transfer resistor 62 includes a transfer electrode 63 and a transfer channel region (not shown in the figures) formed in a semiconductor substrate 64, constituting a charge-transfer portion of a CCD structure.

Further, the transfer electrode 63 includes four transfer electrodes 63A, 63B, 63C and 63D, all of which are formed of a first electrode layer.

Hence, since the transfer electrodes 63A, 63B, 63C and 63D are formed of the same electrode layer, there is no overlapped portion.

However, in the CCD solid-state imaging device thus constructed, as shown in FIG. 4B, two electrodes 63A and 63B are arranged in a portion between pixels adjacent to each other in the vertical direction (in the charge-transfer direction), so that the width between the pixels becomes relatively large.

Accordingly, the area of the light-receiving sensor portion may be reduced. For example, when comparing pixel cells having the same size, the area of the portion may be reduced by approximately 30% than that of the former described structure including two electrode layers.

If the area of the light-receiving sensor portion is reduced as described above, the amount of electric charge to be stored in the light-receiving sensor portion diminishes, so that sensitivity deteriorates and the dynamic range becomes narrow. Further, the effects of shading become large.

In particular, this problem becomes conspicuous when the pixel size is reduced.

The present invention addresses the above-identified, and other problems associated with conventional methods and apparatuses and provides a solid-state imaging device capable of securing sufficient sensitivity and of obtaining favorable characteristics.

Each of a solid-state imaging device according to an embodiment of the present invention and a solid-state imaging device according to an embodiment of a manufacturing method and a driving method of the present invention includes light-receiving sensor portions, each constituting a pixel, arranged in the form of a matrix and a charge-transfer portion provided on one side of each column of the light-receiving sensor portions; wherein a transfer electrode in a charge-transfer portion includes a first transfer electrode formed of a first electrode layer and a second transfer electrode formed by electrically connecting a first electrode layer and a second electrode layer, the first electrode layer of the second transfer electrode is independently formed in each charge-transfer portion, and the first transfer electrode and the second electrode layer in the second transfer electrode are laminated at a portion between pixels adjacent to each other in the direction of the charge-transfer portion.

According to an embodiment of the structure of the above-described solid-state imaging device of the present invention, the transfer electrode in the charge-transfer portion includes the first transfer electrode formed of the first electrode layer and the second transfer electrode formed by electrically connecting a first electrode layer and a second electrode layer and the first electrode layer of the second transfer electrode is independently formed in each charge-transfer portion, so that in the charge-transfer portion, the second transfer electrode is mainly formed of the first electrode layer with only part of the second electrode layer, and therefore the extent to which incident light is blocked by the transfer electrode is greatly reduced in comparison with a structure in related art in which two electrode layers are overlapped.

Further, in a portion between pixels adjacent to each other in the direction of the charge-transfer portion, the first transfer electrode (formed of the first electrode layer) and the second electrode layer in the second transfer electrode are laminated, so that the width of the portion between pixels can be made narrow in comparison with the case in which the transfer electrode includes only a first electrode layer (single-layer electrode structure). Thus, the size of the light-receiving sensor portion can be set large in the direction of the charge-transfer portion.

According to the above-described embodiment of the present invention, the size of the light-receiving sensor portion can be set large to obtain the large area of the light-receiving sensor portion.

Therefore, according to an embodiment of the present invention, a solid-state imaging device having favorable characteristics can be obtained in which a sufficient amount of electric charge can be received by light-receiving sensor portions, and sufficient sensitivity and sufficient dynamic range are secured.

Further, according to an embodiment of the present invention, problems (deterioration in sensitivity, a narrow dynamic range, and the like) conspicuously occurred when a solid-state imaging device is made minute can be solved, so that a solid-state imaging device can be made minute and the increase in the number of pixels and high density of a solid-state imaging device can be obtained. Furthermore, the miniaturization of a solid-state imaging device can also be achieved.

DESCRIPTION OF THE PREFERRED EMBODIMENTS

Figure 5:
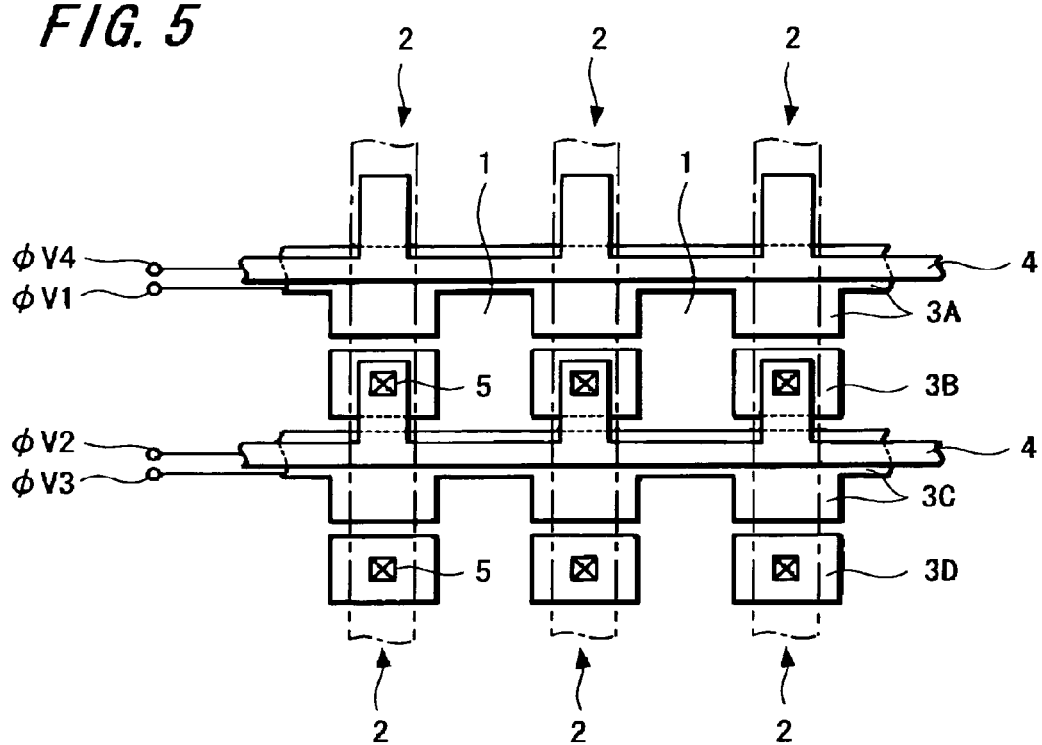
FIG. 5 is a schematic constitutional view (plan view) of a solid-state imaging device according to an embodiment of the present invention.

FIG. 5 is a schematic constitutional view (plan view) showing a solid-state imaging device according to an embodiment of the present invention.

This embodiment is a case in which the present invention is applied to a CCD solid-state imaging device.

In this solid-state imaging device, a vertical transfer resistor 2 is formed on one side of each column of light-receiving sensor portions 1 arranged in the form of a matrix to constitute an imaging area.

Each light-receiving sensor portion 1 constitutes a pixel, and in this embodiment, one portion is provided per pixel.

Outside the imaging area, although not shown in the figure, a horizontal transfer resistor is provided to be connected to one end of the vertical transfer resistor 2, and an output portion is provided at one end of the horizontal transfer resistor.

Figure 6A:
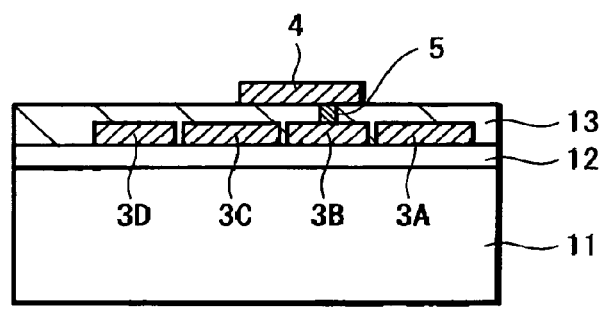
FIG. 6A is a sectional view of a vertical transfer resistor portion in the CCD solid-state imaging device of FIG. 5
Figure 6B:
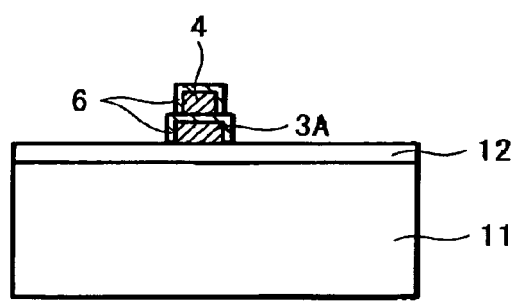
FIG. 6B is a sectional view of a portion between pixels in the CCD solid-state imaging device of FIG. 5.

Further, FIG. 6A is a sectional view of the vertical transfer resistor 2 of the solid-state imaging device shown in FIG. 5; and FIG. 6B is a sectional view of a portion between light-receiving sensor portions 1, namely between pixels, adjacent to each other in the vertical direction of the solid-state imaging device (in the charge-transfer direction of the vertical transfer resistors 2) shown in FIG. 5.

The vertical transfer resistor 2 includes a transfer channel region and a gate insulation film, which are not shown in the figures and which are formed in a semiconductor substrate 11, and a transfer electrode.

Further, although not shown in the figures, a light shielding film is formed covering the transfer electrode. The light shielding film has openings on the light-receiving sensor portions 1 to make light enter the light-receiving sensor portions 1.

Further, although not shown in the figures, above the light shielding film are provided an insulation layer covering the light shielding film, a color filter, on-chip lenses and the like, if necessary.

The solid-state imaging device according to the embodiment particularly has characteristics in the structure of the transfer electrode constituting the vertical transfer resistor 2.

Each of a transfer electrode 3A to which a transfer pulse φV1 of a first phase is applied and a transfer electrode 3C to which a transfer pulse φV3 of a third phase is applied has, as shown in FIG. 5, an electrode portion extending along the vertical transfer resistor 2 and a wiring portion extending between light-receiving sensor portions 1 (between pixels) adjacent to each other in the vertical direction (in the upward and downward directions in the figure).

Further, the transfer electrode 3A to which a transfer pulse φV1 of a first phase is applied and the transfer electrode 3C to which a transfer pulse φV3 of a third phase is applied are formed of a first electrode layer, as shown in FIGS. 6A and 6B. Those transfer electrodes 3A and 3C are formed in common with respect to pixels in the same row by means of the wiring portion.

A transfer electrode 3B to which a transfer pulse φV2 of a second phase is applied and a transfer electrode 3D to which a transfer pulse φV4 of a fourth phase is applied are, as shown in FIG. 5, formed independently in each vertical transfer resistor 2, and each of the electrodes has only an electrode portion extending along the vertical transfer resistor 2.

Further, the transfer electrode 3B to which a transfer pulse φV2 of a second phase is applied and the transfer electrode 3D to which a transfer pulse φV4 of a fourth phase is applied are formed of a first electrode layer, as shown in FIGS. 6A and 6B.

Furthermore, as shown in FIGS. 5 and 6A, a transfer electrode 4 formed of a second electrode layer is through a contact layer 5 connected to each of the transfer electrode 3B to which a transfer pulse φV2 of a second phase is applied and the transfer electrode 3D to which a transfer pulse φV4 of a fourth phase is applied.

This transfer electrode 4 formed of a second electrode layer (hereinafter referred to as a second-layer transfer electrode) has a portion extending along a vertical transfer resistor 2 and being connected to the contact layer 5, and a wiring portion extending between light-receiving sensor portions (between pixels) adjacent to each other in the vertical direction (in the charge-transfer direction).

By means of the wiring portion of the transfer electrode 4, transfer electrodes 3B and 3D independently formed in each of the vertical transfer resistors 2 are electrically connected with respect to those electrodes formed in the same row, and respective vertical transfer pulses φV2 and φV4 are provided thereto.

Since the transfer electrodes 3A, 3B, 3C, 3D and 4 are thus constructed, the transfer electrode 3A and the transfer electrode 4 of two layers are, as shown in FIG. 6B, laminated through an interlayer insulation film 6 in a portion between light-receiving sensor portions 1, namely between pixels, adjacent to each other in the vertical direction.

Figure 1:
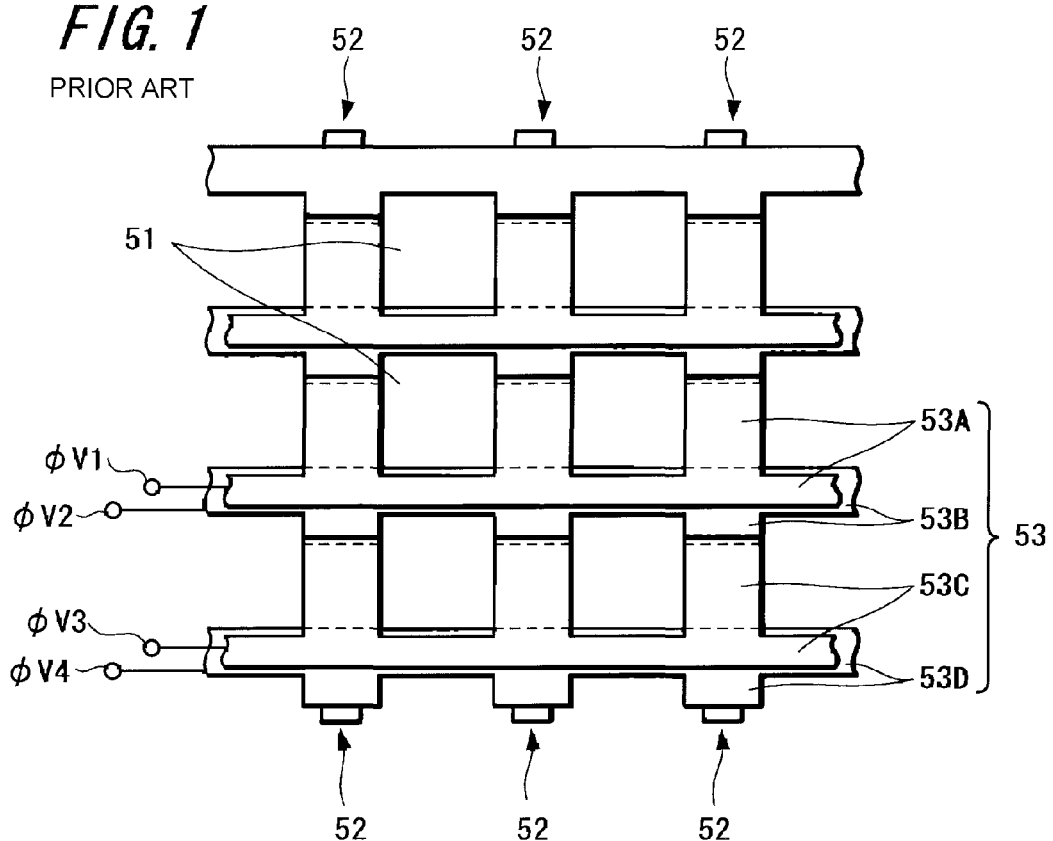
FIG. 1 is a schematic constitutional view (plan view) of a CCD solid-state imaging device in which a transfer electrode includes two layers.
Figure 2A:
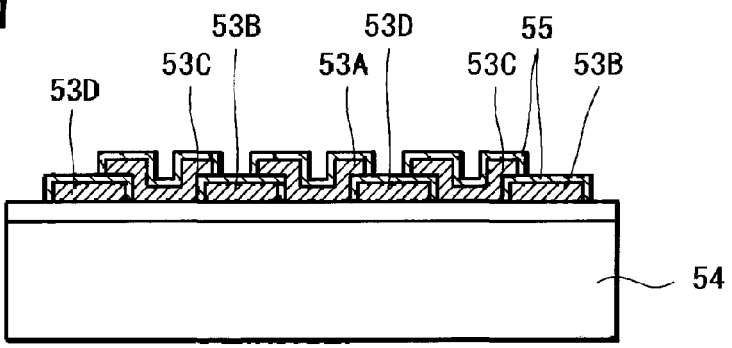
FIG. 2A is a sectional view of a vertical transfer resistor portion in the CCD solid-state imaging device of FIG. 1
Figure 2B:
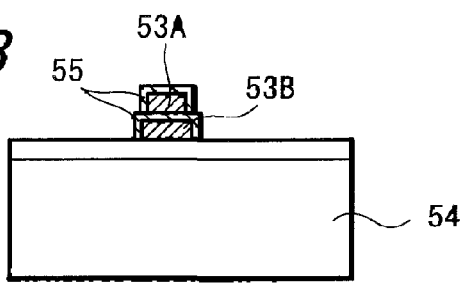
FIG. 2B is a sectional view of a portion between pixels in the CCD solid-state imaging device of FIG. 1.
Figure 3:
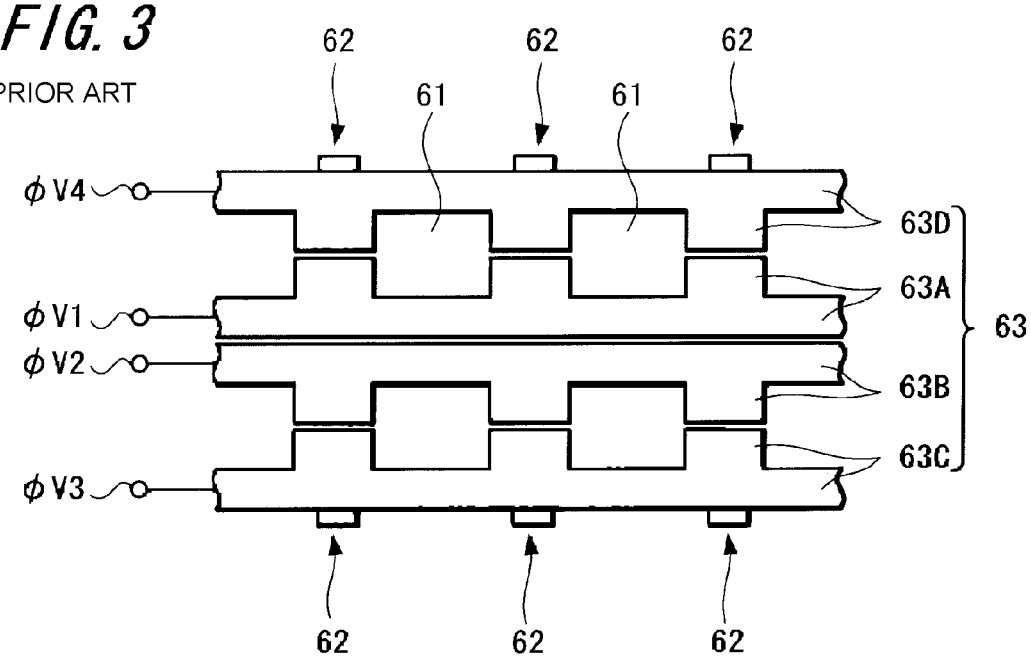
FIG. 3 is a schematic constitutional view (plan view) of a CCD solid-state imaging device in which a transfer electrode is formed of a single layer.
Figure 4A:
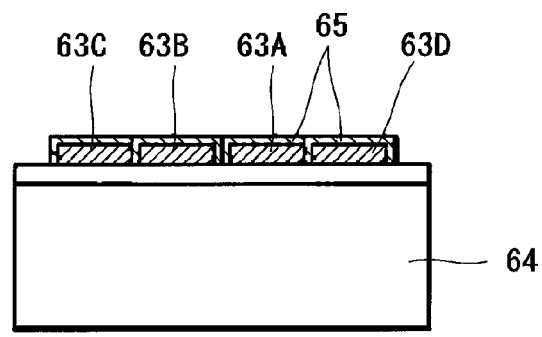
FIG. 4A is a sectional view of a vertical transfer resistor portion in the CCD solid-state imaging device of FIG. 3
Figure 4B:
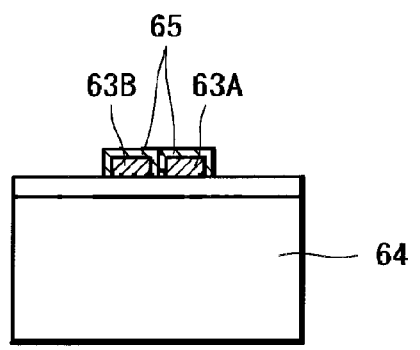
FIG. 4B is a sectional view of a portion between pixels in the CCD solid-state imaging device of FIG. 3.

Accordingly, the width of each transfer electrode between pixels can be reduced in comparison with the case shown in FIG. 4B in which the transfer electrode is formed of a single electrode layer.

For example, with respect to a CCD solid-state imaging device, whose size of a pixel cell is 2.0 μm, having a structure in which the transfer electrode of the vertical transfer resistor is formed of a single electrode layer (single-layer electrode structure), the width of a portion between pixels becomes approximately 0.7 μm, whereas the width of the portion in the laminated structure according to this embodiment becomes approximately 0.3 μm, so that 0.4 μm can be used to increase the size of a photodiode in each light-receiving sensor portion. Thus, the dimensions of a photodiode can be enlarged from 1.0 μm×1.3 μm of a single-layer electrode structure to 1.0 μm×1.7 μm, so that the amount of electric charge received by each light-receiving sensor portion increases by approximately 30%, which enables sufficient sensitivity and sufficient dynamic range to be obtained.

On the other hand, the vertical transfer resistor 2 basically employs the single-layer electrode structure including the transfer electrodes 3A, 3B, 3C and 3D formed of one electrode layer (hereinafter referred to as the first-layer transfer electrode) and the transfer electrode 4 of a second layer only provided in the vicinity of the contact portion 5, and therefore, the extent to which incident light is blocked by those transfer electrodes is greatly reduced in comparison with a two-layer electrode structure in related art.

Various conductive materials including polycrystalline silicon, silicide such as WSi, metals such as W can be used for the transfer electrodes 3A, 3B, 3C and 3D of the first layer.

For the transfer electrode 4 of the second layer as well, various conductive materials can be used. The same material as that of the transfer electrodes 3A, 3B, 3C and 3D formed of the first electrode layer may be used, or a different material may be used to form the transfer electrode 4. Differently from the case in related art in which the transfer electrode is formed of two electrode layers, in the structure according to this embodiment, the transfer electrode 4 of the second layer is not formed right above the gate insulation film, so that there are fewer restrictions on the material of the transfer electrode 4 of the second layer.

Then, in the vertical transfer resistor 2, different vertical transfer pulses φV1, φV2, φV3 and φV4 are applied to the transfer electrodes 3A, 3B, 3C and 3D vertically adjacent to each other, respectively. Thus, vertical transfer of a signal charge by means of four-phase drive is executed.

That is, electric signals generated in the light-receiving sensor portions 1 are read out to vertical transfer resistors under the transfer electrode 3A, 3B, 3C or 3D by the vertical transfer pulse φV1, φV2, φV3 or φV4 applied to the transfer electrode 3A, 3B, 3C or 3D. The vertical transfer pulse φV1, φV2, φ3 or φ4 is applied the transfer electrode 3A, 3B, 3C or 3D in order of one alignment and the electric signals in vertical transfer resistors are transferred vertically.

The contact layer 5 is formed by burying a conductive material into a contact hole made through an interlayer insulation layer 13 between the transfer electrodes 3B and 3D of the first layer and the transfer electrode 4 of the second layer.

Note that the contact layer 5 and the transfer electrode 4 of the second layer can be formed of the same conductive material or different conductive materials.

According to the above-described solid-state imaging device of this embodiment, since the transfer electrode between pixels has a laminated structure in which the transfer electrodes 3A and 3C formed of the first electrode layer and the transfer electrode 4 formed of the second electrode layer are laminated, the width of a portion between pixels can be reduced in comparison with the case in which transfer electrodes are formed only of a first electrode layer (single-layer electrode structure).

Therefore, the size in the vertical direction of the light-receiving sensor portion 1 can be set large to secure the large area for the light-receiving sensor portion, in comparison with a single-layer electrode structure.

Thus, since a sufficient amount of electric charge can be dealt with by the light-receiving sensor portions 1, a solid-state imaging device having favorable characteristics of having sufficient sensitivity and a sufficient dynamic range can be obtained.

Further, according to the solid-state imaging device of this embodiment, the vertical transfer resistor 2 basically employs the single-layer electrode structure including the transfer electrodes 3A, 3B, 3C and 3D formed of one electrode layer and the transfer electrode 4 of a second layer only provided in the vicinity of the contact portion 5 formed by the contact layer 5, and therefore, the extent to which incident light is blocked by those transfer electrodes is greatly reduced in comparison with a two-layer electrode structure in related art.

It should be noted that although in the above-described embodiment a structure is employed in which four-phase drive is executed by applying the vertical transfer pulses φV1, φV2, φV3 and φV4 to the transfer electrode 3 of the vertical transfer resistor 2, the present invention can be applied to other drive methods than that of the four-phase drive.

Similarly to the above-described embodiment, the present invention can be applied to one-phase drive, two-phase drive, four-phase drive, eight-phase drive and 16-phase drive, by providing at a vertical pitch of each pixel both the (first-stage) transfer electrode formed of a first electrode layer connected between rows, and the (second-stage) transfer electrode formed of the first electrode layer independently formed in each vertical transfer resistor (each pixel) and the second electrode layer connected between rows.

Further, in the above-described embodiment, the present invention is applied to a CCD solid-state imaging device including a charge-transfer portion of a CCD structure, however, the present invention can be applied to solid-state imaging devices including charge-transfer portions of other structures.

The present invention is not limited to the above-described embodiment, and various other structures will be acceptable without departing from the gist of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a solid-state imaging device, comprising:
    arranging light-receiving sensor portions each constituting a pixel in the form of a matrix, the matrix having columns aligned in a vertical direction and rows aligned in a horizontal direction;
    forming charge-transfer portions on either side of the columns of said pixels by lamination; and
    forming transfer electrodes in the charge-transfer portions to include a first, second, third and fourth transfer electrodes formed of a first electrode layer arranged along a column direction, and first and second transfer electrodes formed of a second electrode layer arranged along the column direction, the first and second transfer electrodes of the second electrode layer being disposed in the vertical direction above the charge-transfer portions in a vicinity of a contact to decrease the width of the charge-transfer portions in the horizontal direction and increase the light receiving sensor portions in the vertical direction,
    wherein,
    the first electrode layer is laminated below a portion of the second electrode layer between the pixels,
    a contact layer is formed in an insulating layer between at least one of the plurality of transfer electrodes of the first electrode layer and the first and second transfer electrodes of the second electrode layer,
    the first transfer electrode of the second electrode layer is located to overlap with the second and third transfer electrodes of the first electrode layer and the second transfer electrode of the second electrode layer is located to overlap with the fourth transfer electrode of the first electrode layer, and
    the first transfer electrode of the second electrode layer is connected to the second transfer electrode of the first electrode layer and the second transfer electrode of the second electrode layer is connected to the fourth transfer electrode of the second electrode layer by means of respective contact layers.

2. The method of claim 1, wherein the first transfer electrode of the first electrode layer includes an electrode portion extending along the charge-transfer portion and a wiring portion extending between pixels of said light-receiving sensor portions adjacent to each other in the vertical direction in which said charge-transfer portion transfers electric charges.

3. The method of claim 2, wherein the at least one or more of the plurality of transfer electrodes of the first electrode layer are electrically connected to the second electrode layer, and the first transfer electrode of the first electrode layer is formed in common with respect to pixels in the same row by means of the wiring portion.

4. The method of claim 1, wherein said second electrode layer includes a portion which extends along the charge-transfer portion and which is connected to the contact layer, and a wiring portion which extends between pixels of the light-receiving sensor portions adjacent to each other in the vertical direction in which the charge-transfer portion transfers electric charges.

5. The method of claim 1, wherein the at least one or more of the plurality or transfer electrodes of the first electrode layer are electrically connected with respect to pixels in the same row.

6. The method of claim 1, wherein the first transfer electrode of the second electrode layer is disposed above the second transfer electrode of the first electrode layer and about a periphery of the pixels.

7. A method of driving a solid-state imaging device including light-receiving sensor portions each constituting a pixel arranged in the form of a matrix, the matrix having columns aligned in a vertical direction and rows aligned in a horizontal direction, and charge-transfer portions formed on each one side of the columns of the light-receiving sensor portions, in which a transfer electrode in said charge-transfer portion includes a first, second, third and fourth transfer electrode formed of a first electrode layer, and first and second transfer electrodes formed of a second electrode layer, the first and second transfer electrodes of the second electrode layer being disposed in the vertical direction above the charge-transfer portions in a vicinity of a contact to decrease the width of the charge-transfer portions in the horizontal direction and increase the light receiving sensor portions in the vertical direction, the first electrode layer being laminated below a portion of the second electrode layer, a contact layer is formed in an insulating layer which contacts at least one of the plurality of transfer electrodes of the first electrode layer and the first and second transfer electrodes of the second electrode layer, the plurality of transfer electrodes of the first electrode layer are alternately connected to a plurality of vertical transfer electrodes of the second electrode layer, the method comprising:

applying a transfer pulse of a first phase to the first transfer electrode formed of the first electrode layer; and applying a transfer pulse of a third phase to the third transfer electrode formed of the first electrode layer, wherein, the first transfer electrode of the second electrode layer is located to overlap with the second and third transfer electrodes of the first electrode layer and the second transfer electrode of the second electrode layer is located to overlap with the fourth transfer electrode of the first electrode layer, and the first transfer electrode of the second electrode layer is connected to the second transfer electrode of the first electrode layer and the second transfer electrode of the second electrode layer is connected to the fourth transfer electrode of the second electrode layer by means of respective contact layers.

8. A method of claim 7, further comprising:

applying a transfer pulse of a second phase to the second transfer electrode of the first electrode layer, and applying a transfer pulse of a fourth phase to the fourth transfer electrode of the second electrode layer.

9. The method of claim 7, wherein the first transfer electrode of the second electrode layer is disposed above the second transfer electrode of the first electrode layer about periphery of the pixels.

* * * * *